(12) United States Patent
Lee et al.

(10) Patent No.: US 6,910,266 B2
(45) Date of Patent: Jun. 28, 2005

(54) PRINTED CIRCUIT BOARD WITH EMBEDDED CAPACITORS THEREIN, AND PROCESS FOR MANUFACTURING THE SAME

(75) Inventors: Seok-Kyu Lee, Daejeon (KR); Jang-Kyu Kang, Daejeon (KR); Hyun-Ju Jin, Busan (KR); Byoung-Youl Min, Seoul (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/609,618

(22) Filed: Jul. 1, 2003

(65) Prior Publication Data

US 2004/0118600 A1 Jun. 24, 2004

(30) Foreign Application Priority Data

Dec. 24, 2002 (KR) .............................. 10-2002-0083609

(51) Int. Cl.[7] .............................................. H05K 3/30
(52) U.S. Cl. .............................. 29/832; 29/825; 29/846
(58) Field of Search .......................... 29/825, 830, 832, 29/840, 841, 846, 852

(56) References Cited

U.S. PATENT DOCUMENTS

| | | | |
|---|---|---|---|
| 5,079,069 A | | 1/1992 | Howard et al. ............. 428/209 |
| 5,261,153 A | | 11/1993 | Lucas ......................... 29/830 |
| 5,282,312 A | * | 2/1994 | DiStefano et al. ............ 29/830 |
| 5,583,321 A | * | 12/1996 | DiStefano et al. .......... 174/264 |
| 5,590,460 A | * | 1/1997 | DiStefano et al. ............ 29/830 |
| 5,800,575 A | | 9/1998 | Lucas ......................... 29/25.42 |
| 6,274,224 B1 | | 8/2001 | O'Bryan et al. ............ 428/209 |
| 6,349,456 B1 | | 2/2002 | Dunn et al. ................. 29/25.42 |
| 6,724,638 B1 | * | 4/2004 | Inagaki et al. .............. 361/763 |

* cited by examiner

Primary Examiner—Carl J. Arbes
(74) Attorney, Agent, or Firm—Morgan Lewis & Bockius LLP

(57) ABSTRACT

Disclosed herein are a printed circuit board with embedded capacitors therein and a process for manufacturing the printed circuit board. The embedded capacitors are formed by applying a photosensitive insulating resin to a printed circuit board inner layer, and applying a high dielectric polymer capacitor paste thereto. The process for manufacturing a printed circuit board with embedded capacitors therein comprises the steps of: i) laminating photoresist dry films to a copper clad FR-4, exposing to light and developing the dry films, and etching copper foils of the copper clad FR-4 to form bottom electrodes for forming capacitors; ii) applying a photosensitive insulating resin to the surfaces of the bottom electrodes, and exposing to light and developing to etch the photosensitive insulating resin; iii) applying a capacitor paste to the etched regions and curing the capacitor paste; iv) plating the upper regions of the cured capacitor paste and the photosensitive insulating resin using an electroless copper plating process to form copper foil layers for top electrodes; v) laminating photosensitive dry films to the copper foil layers for top electrodes, and exposing to light and developing the photosensitive dry films to etch regions of the dry films except for the copper foil layers where the top electrodes are to be formed; and vi) etching the regions of the dry films except for the copper foil layers where the top electrodes are to be formed, and the dry films formed on the top electrodes are removed so that the capacitor paste is discretely positioned between the top electrodes and the bottom electrodes to form discrete capacitors.

14 Claims, 14 Drawing Sheets

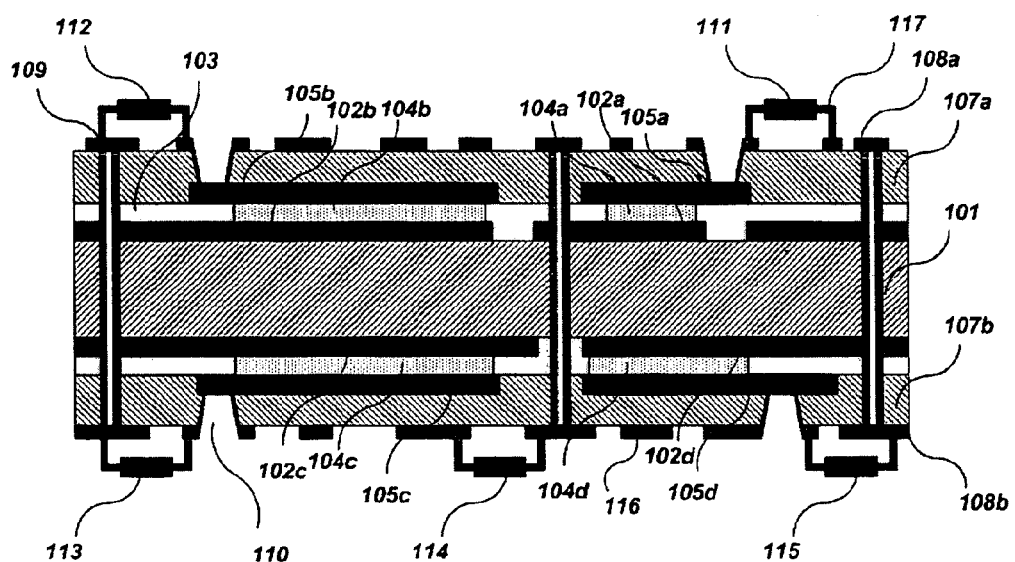

PRINTED CIRCUIT BOARD WITH EMBEDDED CAPACITORS THEREIN, AND PROCESS FOR MANUFACTURING THE SAME

BACKGROUND OF THE INVENTION

1. Field of the Invention

The present invention relates to a printed circuit board with embedded capacitors therein, and a process for manufacturing the printed circuit board. More particularly, the present invention relates to a printed circuit board with embedded capacitors therein in which the embedded capacitors are formed by applying a photosensitive insulating resin to a printed circuit board (PCB) inner layer and applying a high dielectric polymer capacitor paste thereto, and a process for manufacturing the printed circuit board.

2. Description of the Related Art

Common discrete chip resistors or discrete chip capacitors have been mounted on the surfaces of conventional printed circuit boards (PCBs). Recently, printed circuit boards with embedded passive devices such as resistors, capacitors, etc. therein are developed.

Such printed circuit boards with embedded passive devices therein are manufactured by a process comprising inserting passive devices such as resistors, capacitors, etc., into an inner or outer layer of a substrate using novel materials (substances) and processes, thereby replacing the functions of conventional chip resistors and chip capacitors. That is, the printed circuit boards with embedded passive devices therein include passive devices, e.g., capacitors, buried in the inner or outer layer of the substrate. The term "embedded capacitors" used herein refers to capacitors as passive devices which are mounted as parts of a printed circuit board, irregardless of the size of a substrate. The substrate is referred to as "embedded capacitor PCB". The most important advantage of the embedded capacitor PCB is that since the capacitors are mounted as parts of the printed circuit board, there is no need to mount the capacitors on the surfaces of the printed circuit board.

On the other hand, recent techniques for manufacturing the embedded capacitor printed circuit board are largely classified into the following three techniques:

The first technique is a method for manufacturing polymer thick film type capacitors comprising application of a polymer capacitor paste and thermal curing (that is, drying) of the paste. Specifically, according to this method, the embedded capacitors are formed by applying the polymer capacitor paste to the printed circuit board inner layer, drying the polymer capacitor paste, printing a copper paste on the resulting printed circuit board to form electrodes and drying the copper paste.

The second technique is a method for manufacturing embedded discrete type capacitors comprising coating a ceramic filled photo-dielectric resin onto a printed circuit board. The related patent is owned by Motorola Inc. Specifically, according to this method, the discrete capacitors are formed by coating the photo-dielectric resin containing ceramic powders onto both surfaces of a substrate, laminating copper foils thereto to form respective top electrodes and bottom electrodes, forming circuit patterns thereon, and etching the photo-dielectric resin.

The third technique is a method for manufacturing power distributed decoupling capacitors comprising inserting dielectric layers having a capacitance characteristic into the printed circuit board inner layer, thereby replacing decoupling capacitors mounted on the surfaces of the conventional printed circuit boards. The related patent is owned by Sanmina Corp. Specifically, according to this method, power distributed decoupling capacitors are formed by a process comprising inserting dielectric layers composed of power electrodes and ground electrodes into the inner layers of the printed circuit board.

A variety of processes are developed based on the three techniques discussed above. Procedures for carrying out the processes are different from each other. Since a market for the printed circuit boards with embedded capacitors therein is small, the standardization of these techniques is not yet achieved and trials to develop commercially available processes are still ongoing.

Hereinafter, printed circuit boards with embedded capacitors therein and the processes for manufacturing the printed circuit boards according to the prior arts will be explained in more detail with reference to the accompanying drawings.

The first prior art is explained with reference to FIGS. 1a to 1e.

FIGS. 1a to 1e are sectional views showing a process for manufacturing a printed circuit board with embedded polymer thick film type capacitors therein according to the first prior art. Referring to FIGS. 1a to 1e, the printed circuit board with embedded polymer thick film type capacitors is manufactured by a process comprising application of a polymer capacitor paste and thermal drying (that is, curing) of the paste.

In step 1, a dry film is coated onto a copper foil of a PCB inner layer 42 composed of FR-4, and then subject to light exposure and development. The copper foil is etched to form copper foils 44a and 44b for positive (+) electrodes, copper foils 43a and 43b for negative (−) electrodes and clearances formed therebetween (FIG. 1a).

In step 2, a capacitor paste, a polymer containing ceramic powders of high dielectric constant, is applied to the copper foils 43a and 43b for negative (−) electrodes using a screen-printing manner, and is then dried or cured (FIG. 1b). The screen-printing manner refers to a printing method in which a medium, e.g., ink, is passed through a stencil screen using a squeezer to form a pattern on a substrate surface.

At this step, screened capacitor pastes 45a and 45b cover the copper foils 44a and 44b for positive (+) electrodes, the copper foils 43a and 43b for negative (−) electrodes and the clearances formed therebetween.

In step 3, a conductive paste such as silver and copper paste is applied to the resulting structure using a screen-printing manner to form positive (+) electrodes 46a and 46b, and then dried or cured (FIG. 1c).

In step 4, the capacitor layer formed on a copper foil 41 of the PCB inner layer 42 formed through the previous steps 1 to 3 is inserted between insulators 47a and 47b, and then the three layers are laminated to each other (FIG. 1d), wherein reference numerals 48a and 48b designate copper foil layers attached onto insulators 47a and 47b, respectively.

In step 5, through-holes (TH) and laser blinded via holes (LBVH) 49a and 49b are formed on the laminated product. The capacitors present in the interior of the laminated product are connected to corresponding positive (+) terminals 51a and 51b and negative terminals 50a and 50b of IC chips 52a and 52b through via the through-holes (TH) and the laser blinded via holes (LBVH) 49a and 49b, respectively. Accordingly, the capacitors function as embedded capacitors (FIG. 1e).

One of the problems concerning the first technique of the conventional techniques discussed above is the occurrence of cracks of the capacitor pastes 45a and 45b at ends of the positive (+) electrodes 46a and 46b.

FIGS. 2a and 2b are sectional views illustrating problems of the printed circuit board manufactured by the process shown in FIGS. 1a to 1e, respectively.

Referring to FIG. 1b, when the capacitor pastes 45a and 45b are printed on the copper foils 43a and 43b for negative (−) electrodes and dried in step 2 above, cracks (C) occur as shown in FIG. 2a. The occurrence of cracks (C) results from the thickness of the copper foils for negative (−) electrodes. The copper foils of the PCB inner layer commonly have a thickness of ½ oz (18 μm) or 1 oz (36 μm). Since the thickness of the printed capacitors is about 10 μm, cracks occur at ends of the copper foils for negative (−) electrodes. The cracks also cause problems that when the copper pastes 45a and 45b connected to the copper foils 44a and 44b for positive (+) electrodes are printed, an interlayer short between the negative (−) electrodes and the positive (+) electrodes is poor.

In addition, the second problem concerning the first technique of the conventional techniques discussed above is non-uniform insulation distance between a first layer and a second layer shown in FIG. 1e.

When the embedded capacitors 45a and 45b are formed in accordance with the steps of FIG. 1a to 1e and the insulators 47a and 47b are laminated as shown in step 4, the difference between the insulation distance from the capacitors to a first layer (designated by A) and the insulation distance from a second layer (designated by B) or a third layer in the inner layer core to the first layer, becomes large (FIG. 2b). For example, when the insulators have a thickness of 80 μm, the insulation distance (A) from the copper power electrodes 46a and 46b of the inner layer capacitors to the first layer is 20~30 μm, while the insulation distance (B) from the FR-4 core 42 or the copper foils of the second layer to the first layer is 60~70 μm. The difference between the insulation distances is because both the capacitor pastes 45a and 45b and the copper power electrodes 46a and 46b have a thickness of 10~15 μm. The difference in the insulation distances leads to poor impedance of signal circuits in the first layer and the second layer.

Furthermore, the third problem concerning the first technique of the conventional techniques discussed above is the presence of impurities occurring during printing and drying of the capacitor pastes 45a and 45b and copper pastes 46a and 46b.

As shown in FIG. 1b, after the capacitor pastes 45a and 45b are printed in a thickness of 10~15 μm, dried at 150° C. or higher for 30~90 minutes, the copper pastes 46a and 46b are printed thereon and dried. At this time, impurities occur during the printing. When the printed copper pastes 46a and 46b are dried, a number of voids are formed due to the impurities. The voids lead to a poor interlayer short between the positive (+) electrodes and the negative (−) electrodes when the copper pastes 46a and 46b connected to the copper foils 44a and 44b for positive (+) electrodes are printed on the capacitor pastes 45a and 45b and then dried.

Next, the second technique will be explained with reference to FIGS. 3a to 3c.

FIGS. 3a to 3f are sectional views showing a process for manufacturing a printed circuit board with embedded discrete capacitors formed by coating a photo-dielectric resin in accordance with a prior art. The embedded discrete type capacitors are formed by a process comprising coating the ceramic filled photo-dielectric resin onto a printed circuit board. The process will be explained with reference with U.S. Pat. No. 6,349,456 issued to Motorola Inc.

In step 1, a dielectric layer 14 containing ceramic powders is coated onto a substrate 10 on which a conductor layer 12 is formed, and then subjected to light exposure and thermal drying (FIG. 3a).

In step 2, a laminate copper foil 16 is applied to the surface of the dried dielectric layer 14 (FIG. 3b). The reference numeral 18 designates a sacrificial layer tin-plated onto the copper foil 16 to use as a copper etching resist.

In step 3, a dry film is laminated to the sacrificial layer 18, and then exposed to light and developed. The sacrificial layer 18 and the copper foil 16 are etched to form top electrodes 20 (FIG. 3c).

In step 4, the dielectric layer 14 underlying the top electrode 20 is exposed to light, and then the resulting dielectric layers 22 are etched. The top copper electrodes 20 serve as photomasks for the dielectric layer 14 (FIG. 3d).

In step 5, the copper foil 12 underlying the etched dielectric layers 22 is etched to form bottom electrodes 24 (FIG. 3e).

In final step 6, the capacitor layer 32 formed through the previous steps 1 to 5 is inserted between insulators 26, and then metal layers are laminated thereon (FIG. 3f).

Thereafter, the capacitors 32 present in the interior of the laminated product are connected to corresponding power terminals and ground terminals of IC chips mounted on the exterior of the laminated product through via the through-holes (TH) and the laser blinded via holes (LBVH), respectively.

The first problem concerning the second technique of the conventional techniques discussed above is high manufacturing cost.

That is, in order to manufacture the embedded discrete type capacitors by coating the ceramic filled photo-dielectric resin 14 onto the substrate, both the top electrode 20 and the bottom electrode 24 must be formed. In this case, many steps, which greatly increase manufacturing cost, are required. In addition, since the technique comprises printing the photo-dielectric resin 14 on the entire surface of the bottom electrodes 12 (a copper foil layer), exposing to light, and etching to remove regions responded to light, more of the photo-dielectric resin than expected is required even to manufacture a small number of the embedded capacitors. Accordingly, the technique is economically disadvantageous in terms of considerable loss of raw materials.

The second problem concerning the second technique of the conventional techniques discussed above is interlayer shorts between the bottom electrodes 24.

Specifically, the laminate copper foil 16 is circuit-formed to form the top electrodes 20. When the photo-dielectric resin 14 underlying the copper foil 16 is exposed to light, followed by etching using an etchant to remove regions responded to light, the width of the removed regions may be small. The small width carries a risk that the unetched dielectric resin 14 may remain at the surface of the copper foil 12. This is because when the photo-dielectric resin 14 is thermally cured (110° C., 60 min.), a photosensitive agent present in the photo-dielectric resin 14 is not completely reacted. In particular, the photo-dielectric resin 14 located in the lower copper foil 12 may be unetched, thus resulting in unetched lower copper foil 12. Finally, interlayer shorts between the bottom electrodes 24 may occur.

Next, the third conventional technique will be explained in more detail with reference to FIGS. 4a to 4c.

FIGS. 4a to 4c are sectional views showing a process for manufacturing a printed circuit board with embedded capacitors by inserting a dielectric layer having a capacitance characteristic, in accordance with a prior art. The embedded capacitors are formed by a process comprising inserting a separate dielectric layer having a capacitance characteristic into the printed circuit board inner layer. The embedded capacitors thus manufactured can replace decoupling capacitors mounted to the surface of the substrate. The process will be explained with reference with U.S. Pat. Nos. 5,079,069, 5,261,153 and 5,800,575 issued to Sanmina Corp.

In step 1, a dry film is deposited on a high electric copper coated laminate 61 between copper foils 63a and 63b, and subjected to light exposure and development. Then, the copper foils 63a and 63b are etched to form power electrodes and clearances (FIG. 4a).

In step 2, the resulting structure is inserted between insulators 64a and 64b, and then outer-layer copper foils 65a and 65b are laminated thereto (FIG. 4b).

In step 3, the capacitors present in the interior of the laminated product are connected to corresponding power terminals and ground terminals of IC chips 68a and 68b mounted on the exterior of the laminated product through via through-holes (TH) and laser blinded via holes (LBVH), respectively. The capacitors serve as power distributed decoupling capacitors (FIG. 4c). Reference numerals 67a and 67b designate clearance between a ground electrode and a power electrode, respectively. When the through-holes and laser blinded via holes are formed between the ground electrode and the power electrode, they are spaced sufficiently apart from the ground electrode and the power electrode not to contact one another.

The first problem concerning the third technique of the conventional techniques discussed above is low capacitance due to low dielectric constant of the embedded capacitor layer.

Specifically, in the case of a thin film type having a thickness of 10~50 µm as shown in FIG. 4a, FR-4 (manufactured by Sanmina Corp.) having a thickness of 25 µm or 50 µm as a dielectric material is disposed between the copper foils used as power electrodes and ground electrodes. The FR-4 has a dielectric constant of 4~5 and a capacitance value per unit area of 0.5~1 nF/in². Since the capacitance value of the FR-4 is considerably low, compared to that of currently used decoupling discrete chip capacitors (100 nf/in²), there are many a limitation in manufacturing embedded capacitors.

The second problem concerning the third technique of the conventional techniques discussed above is an increase in the thickness of a printed circuit board due to insertion of embedded capacitor layers.

Specifically, in order to manufacture a printed circuit board with embedded capacitors therein having a high capacitance using the FR-4 dielectric material, the insertion of a large number of embedded capacitor layers, which increases in thickness of the printed circuit board to be manufactured, is required. Accordingly, the technique is economically disadvantageous in terms of increased manufacturing cost.

The third problem concerning the third technique of the conventional techniques discussed above is the occurrence of interlayer shorts and cracks between power electrodes and ground electrodes. Specifically, in the case of using a thin dielectric material to obtain a high capacitance value, during dry film lamination and circuit formation of an upper copper foil for power electrodes and a lower copper foil for ground electrodes, as shown in FIG. 5, interlayer shorts and cracks between the power electrodes and the ground electrodes occur.

FIG. 5 is a sectional view illustrating a problem of a printed circuit board with embedded capacitors therein manufactured by a process comprising inserting a dielectric layer having a capacitance characteristic, in accordance with a prior art. In a printed circuit board with embedded capacitors therein, the capacitors being formed by inserting a dielectric layer having a capacitance characteristic in accordance with a prior art, interlayer shorts (designated by G) and cracks (designated by F) between power electrodes 92 having a thickness of 18~35 µm and ground electrodes 93 on a high dielectric layer 91 having a thickness of 8~10 µm occur, as shown in FIG. 5.

On the other hand, capacitance is dependent on the area and thickness of a capacitor, and is given by the following equation 1:

$$C = \varepsilon_r \cdot \varepsilon_0 \left(\frac{A}{D}\right) \qquad \text{Equation 1}$$

wherein $\varepsilon_r$ is the dielectric constant of a dielectric material, $\varepsilon_o$ is a constant of $8.885 \times 10^{-8}$, A is the surface area of the dielectric material, and D is the thickness of the dielectric material. That is, in order to obtain high capacity capacitors, the dielectric constant of a dielectric material must be high, the thickness of the dielectric material must be small, and the surface area of the dielectric material must be large. In addition, when the thickness is 10 µm, the capacitance of the bimodal polymer ceramic composite is 5~7 nF/cm².

For example, according to U.S. Pat. No. 6,274,224 issued to 3M Innovative Properties Co., a thin film type dielectric material is disposed between the copper foils used as power electrodes and ground electrodes. The dielectric material is a composite of high dielectric $BaTiO_3$ ceramic powders and a thermosetting epoxy resin or polyimide and has a thickness of 8~10 µm. Although the dielectric material has a relatively high capacitance (10 nF/in²) per unit area, there are problems of interlayer shorts and cracks between power electrodes and ground electrodes due to low thickness of the dielectric material.

SUMMARY OF THE INVENTION

Therefore, the present invention has been made in view of the above problems, and it is an object of the present invention to provide a printed circuit board with embedded capacitors therein and a process for manufacturing the printed circuit board wherein a photosensitive insulating resin and a high dielectric polymer capacitor paste are applied to form embedded capacitors, thereby ensuring high capacitance values.

It is another object of the present invention to provide a printed circuit board with embedded capacitors therein and a process for manufacturing the printed circuit board wherein power distributed decoupling capacitors and signal matching discrete capacitors can be simultaneously formed.

It is another object of the present invention to provide a printed circuit board with embedded capacitors therein and a process for manufacturing the printed circuit board wherein the capacitance per unit area can be ensured with more precision using a photosensitive insulating resin.

It is another object of the present invention to provide a printed circuit board with embedded capacitors therein and a process for manufacturing the printed circuit board wherein the thickness of a photosensitive insulating resin applied on entire surfaces of a printed circuit board inner layer can be maintained to be constant, thereby being applicable to products usable even at relatively high frequencies.

It is yet another object of the present invention to provide a printed circuit board with embedded capacitors therein and a process for manufacturing the printed circuit board wherein only desired regions can be applied with a capacitor paste and unnecessary steps such as etching of dielectric material can be eliminated, thereby decreasing the use of expensive raw materials and facilitating the manufacture of the printed circuit board at low cost.

In order to accomplish the above objects of the present invention, there is provided a process for manufacturing a printed circuit board with embedded capacitors therein, comprising the steps of:

i) laminating photoresist dry films to a copper clad FR-4, exposing to light and developing the dry films, and etching copper foils of the copper clad FR-4 to form bottom electrodes for forming capacitors;

ii) applying a photosensitive insulating resin to the surfaces of the bottom electrodes, and exposing to light and developing to etch the photosensitive insulating resin;

iii) applying a capacitor paste to the etched regions and curing the capacitor paste;

iv) plating the upper regions of the cured capacitor paste and the photosensitive insulating resin using an electroless copper plating process to form copper foil layers for top electrodes;

v) laminating photosensitive dry films to the copper foil layers for top electrodes, and exposing to light and developing the photosensitive dry films to etch regions of the dry films except for the copper foil layers where the top electrodes are to be formed; and vi) etching the regions of the dry films except for the copper foil layers where the top electrodes are to be formed, and the dry films formed on the top electrodes are removed so that the capacitor paste is discretely positioned between the top electrodes and the bottom electrodes to form discrete capacitors.

In a preferred embodiment of the present invention, in step ii), the photosensitive insulating resin is applied on the surfaces of the bottom electrodes so that the capacitor paste is printed in a uniform height, and is filled in etched regions of ground electrodes of power distributed decoupling capacitors and bottom electrodes of signal matching discrete capacitors to act as an insulating layer. The photosensitive insulating resin permanently remains in the printed circuit board to be manufactured.

Step iii) may further include applying the capacitor paste using a screen-printing manner; and curing the applied capacitor paste in an oven drier at 150~170° C. for 30 minutes.

In a preferred embodiment of the present invention, the capacitor paste is preferably a composite of high dielectric $BaTiO_3$ ceramic powders having a dielectric constant of 1,000~10,000 and a thermosetting epoxy resin or polyimide. The $BaTiO_3$ ceramic powders may be bimodal in terms of their particle size. That is, the $BaTiO_3$ powders are composed of coarse powders having a particle diameter of 0.9 μm and fine powders having a particle diameter of 60 nm, with a volume ratio in the range of 3:1~5:1. The $BaTiO_3$ powders are homogeneously dispersed in the epoxy resin. The dispersion thus obtained is preferably a polymer ceramic composite having a dielectric constant of about 80~90.

In a preferred embodiment of the present invention, the copper foil layers for top electrodes have broader lands than the regions applied by the capacitor paste.

In a preferred embodiment of the present invention, in step iii), 2~3 μm of the printed and dried capacitor paste is preferably polished off using a ceramic buff so as to adjust the height to be uniform.

In a preferred embodiment of the present invention, step iv) includes plating 1~2 μm thick copper foil layers on surfaces of the cured capacitor paste and the photosensitive insulating resin using an electroless plating process and further plating 10~15 μm thick copper foil layers on the electroless-plated copper foil layers using an electro plating process.

The process for manufacturing a printed circuit board according to the present invention may further comprise the steps of vii) laminating resin coated copper (RCC) layers to the entire surface of the top electrodes; and viii) forming micro-via holes and through holes through the resin coated copper (RCC) layers and then plating the micro-via holes and the through holes.

In a preferred embodiment of the present invention, the resin coated copper (RCC) layers are laminated by a build-up process. The through holes are connected to the bottom electrodes and the via holes are connected to the top electrodes, respectively.

In a preferred embodiment of the present invention, step viii) includes forming the micro-via holes using a laser drill; forming the through-holes using a mechanical drill; and plating the micro-via holes and the through-holes using an electroless plating process.

The process for manufacturing a printed circuit board according to the present invention may further comprise the step of ix) forming signal circuits on the resin coated copper (RCC) layers, and connecting IC chips having different operating voltages to the signal matching capacitors and the power distributed decoupling capacitors commonly connected the ground electrodes, respectively, depending on the divided top electrodes and bottom electrodes.

In accordance with another aspect of the present invention, there is provided a printed circuit board with embedded capacitors therein, comprising:

a) a copper clad FR-4;

b) bottom electrodes for capacitors formed by etching the copper clad FR-4;

c) a photosensitive insulating resin applied to the surfaces of the bottom electrodes, predetermined regions of the photosensitive insulating resin being etched;

d) a capacitor paste applied to the predetermined regions of the photosensitive insulating resin and cured; and e) copper foil layers for top electrodes formed by plating the surfaces of the cured capacitor paste and the photosensitive insulating resin using an electroless copper plating process, wherein regions except for the copper foil layers where the top electrodes are formed are etched, and the dry films formed on the top electrodes are removed so that the capacitor paste is discretely positioned between the top electrodes and the bottom electrodes to form discrete capacitors.

BRIEF DESCRIPTION OF THE DRAWINGS

The above and other objects, features and other advantages of the present invention will be more clearly understood from the following detailed description taken in conjunction with the accompanying drawings, in which:

FIGS. 7a to 7i are sectional views showing a process for manufacturing a printed circuit board with embedded capacitors therein according to the embodiments of the present invention.

DESCRIPTION OF THE PREFERRED EMBODIMENTS

Hereinafter, a printed circuit board with embedded capacitors therein and a process for manufacturing the printed circuit board according to the embodiments of the present invention will be explained in more detail with reference to the accompanying drawings.

Figure 1A:
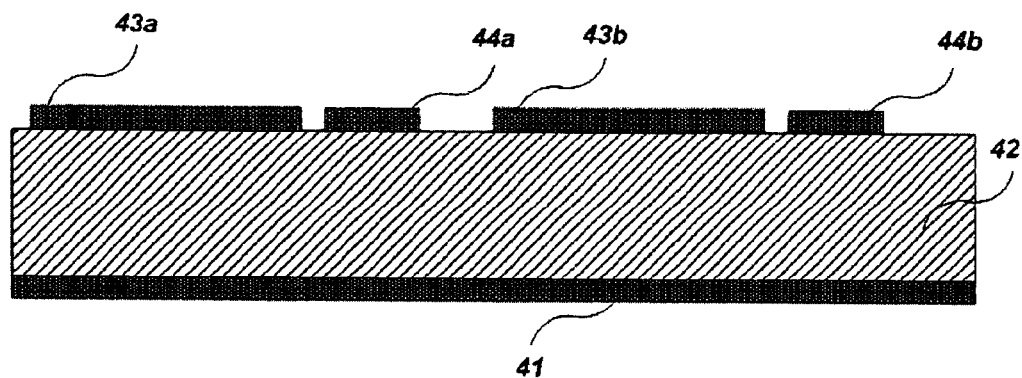
FIGS. 1a to 1e are sectional views showing a process for manufacturing a printed circuit board with embedded polymer thick film type capacitors therein according to a prior art.
Figure 1B:
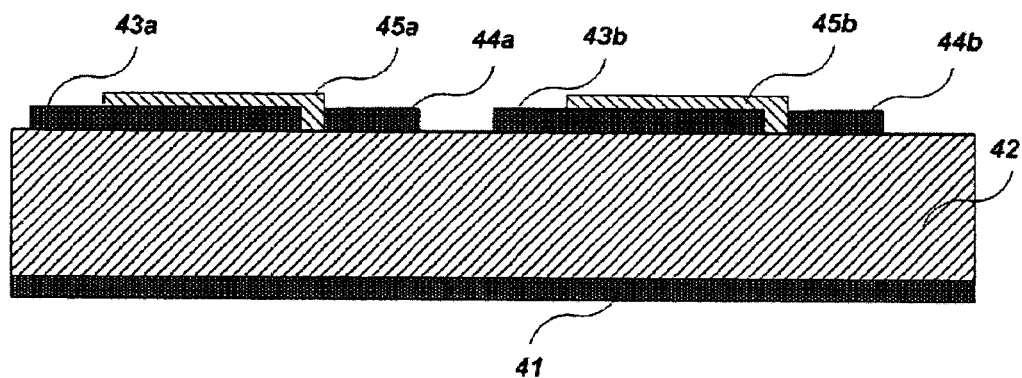
Figure 1C:
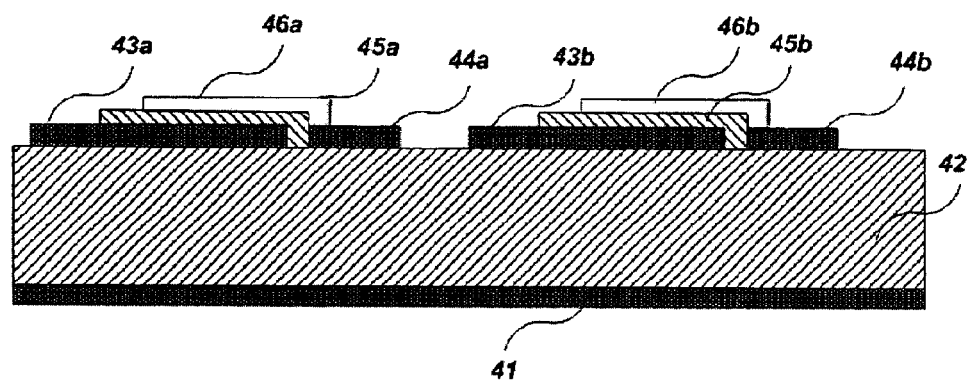
Figure 1D:
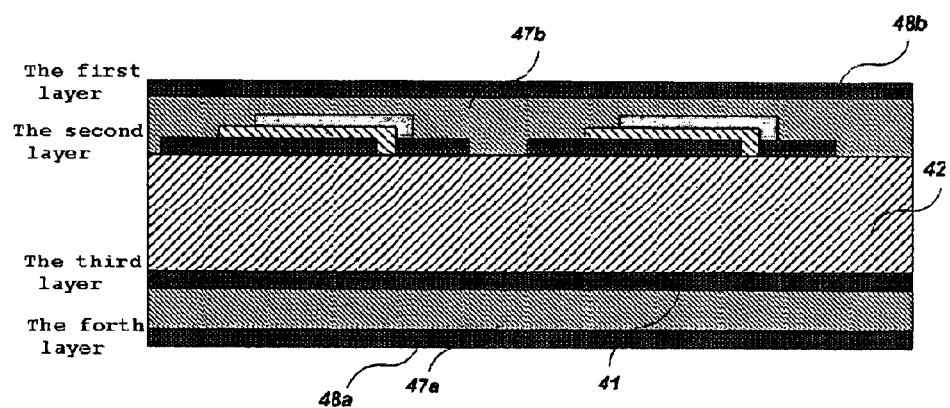
Figure 1E:
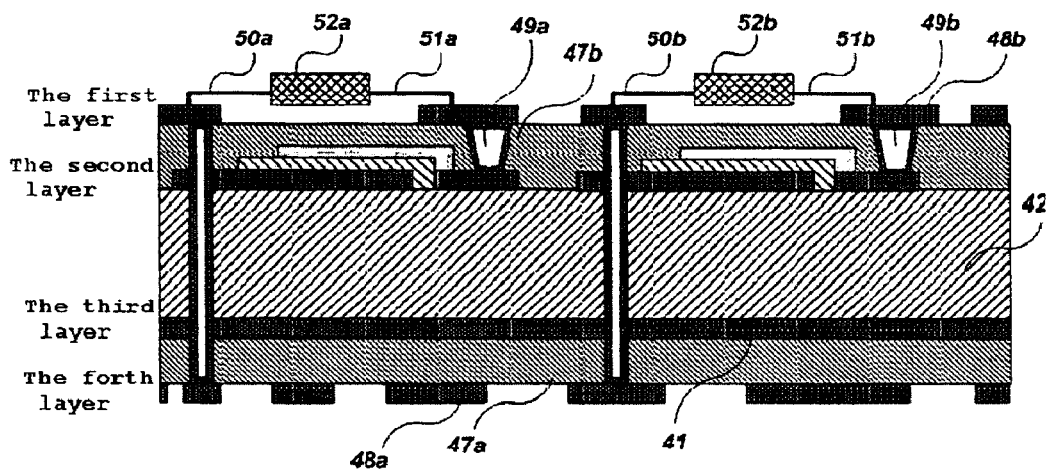
Figure 2A:
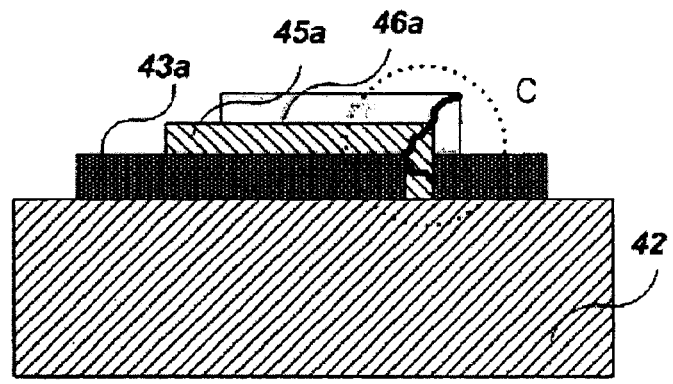
FIGS. 2a and 2b are sectional views illustrating problems of the printed circuit board manufactured by the process shown in FIGS. 1a to 1e, respectively.
Figure 2B:
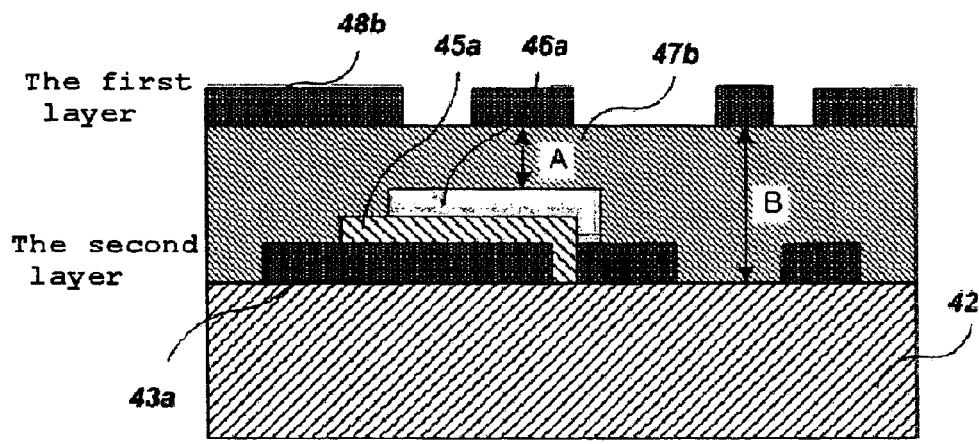
Figure 3A:
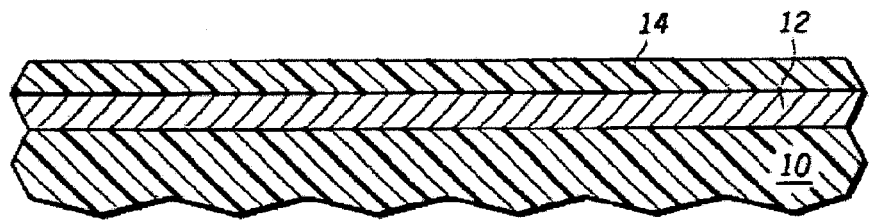
FIGS. 3a to 3f are sectional views showing a process for manufacturing a printed circuit board with embedded discrete capacitors formed by coating a photo-dielectric resin in accordance with a prior art.
Figure 3B:
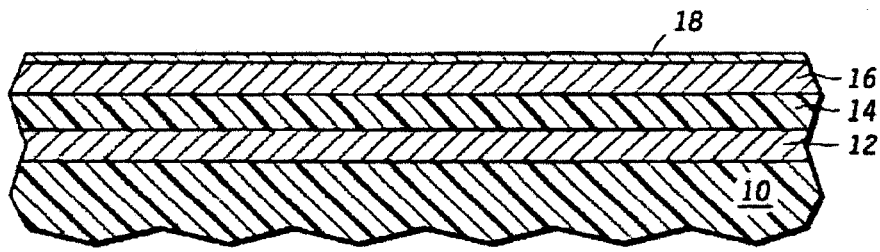
Figure 3C:
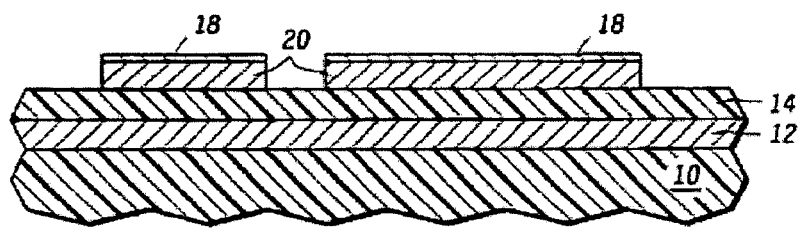
Figure 3D:
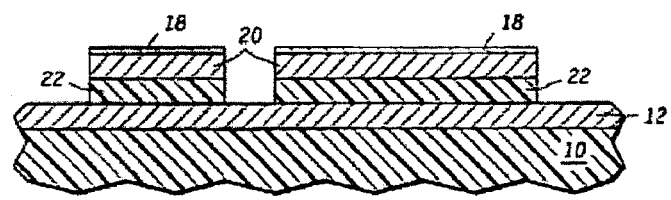
Figure 3E:
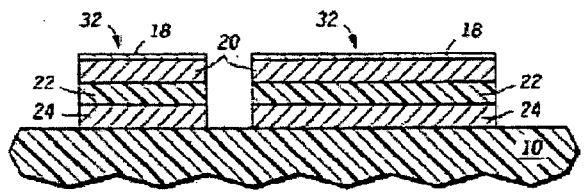
Figure 3F:
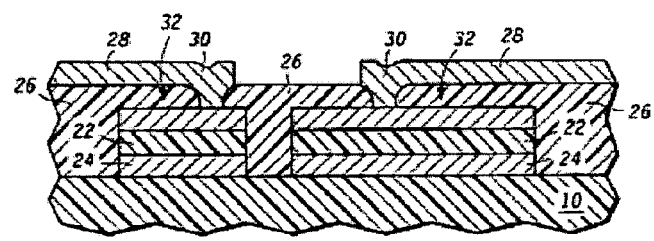
Figure 4A:
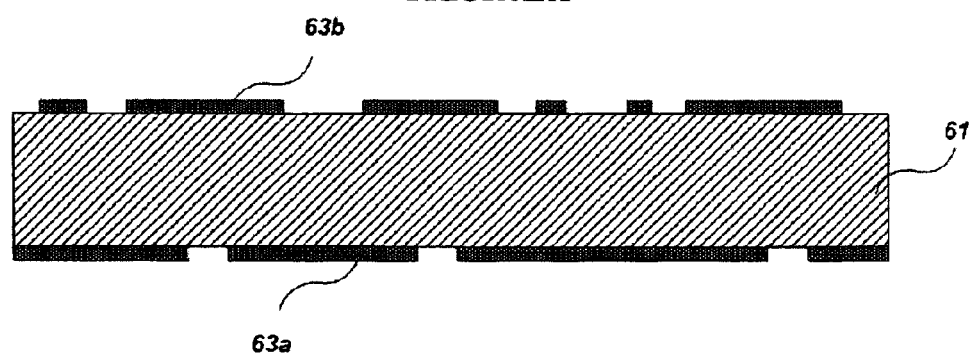
FIGS. 4a to 4c are sectional views showing a process for manufacturing a printed circuit board with embedded capacitors therein by inserting a dielectric layer having a capacitance characteristic, in accordance with a prior art.
Figure 4B:
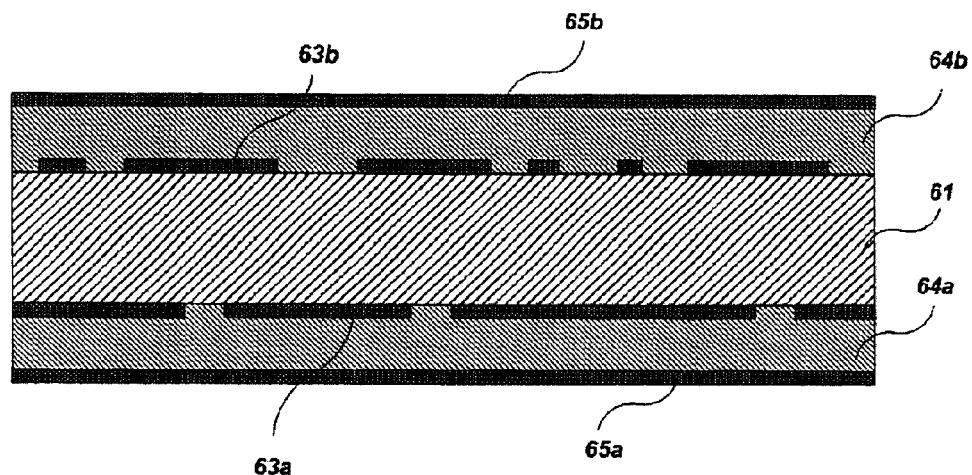
Figure 4C:
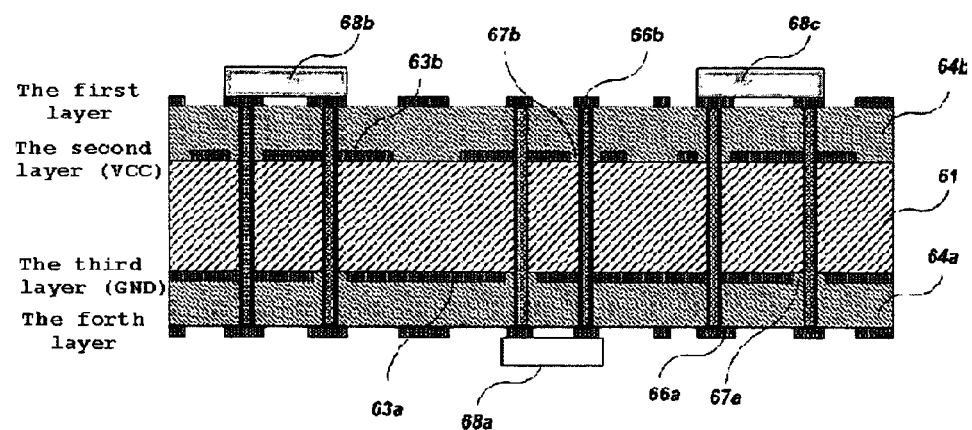
Figure 5:
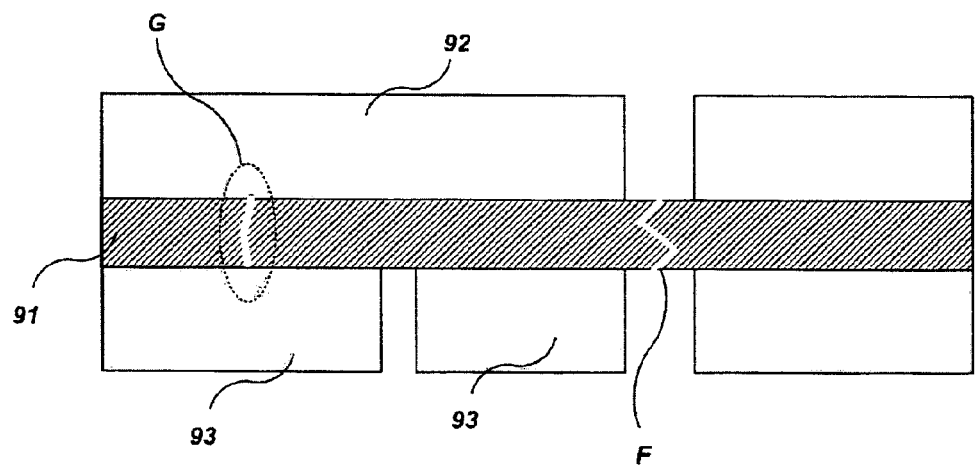
FIG. 5 is a sectional view illustrating a problem of the printed circuit board manufactured by the process shown in FIGS. 4a to 4c.
Figure 6:
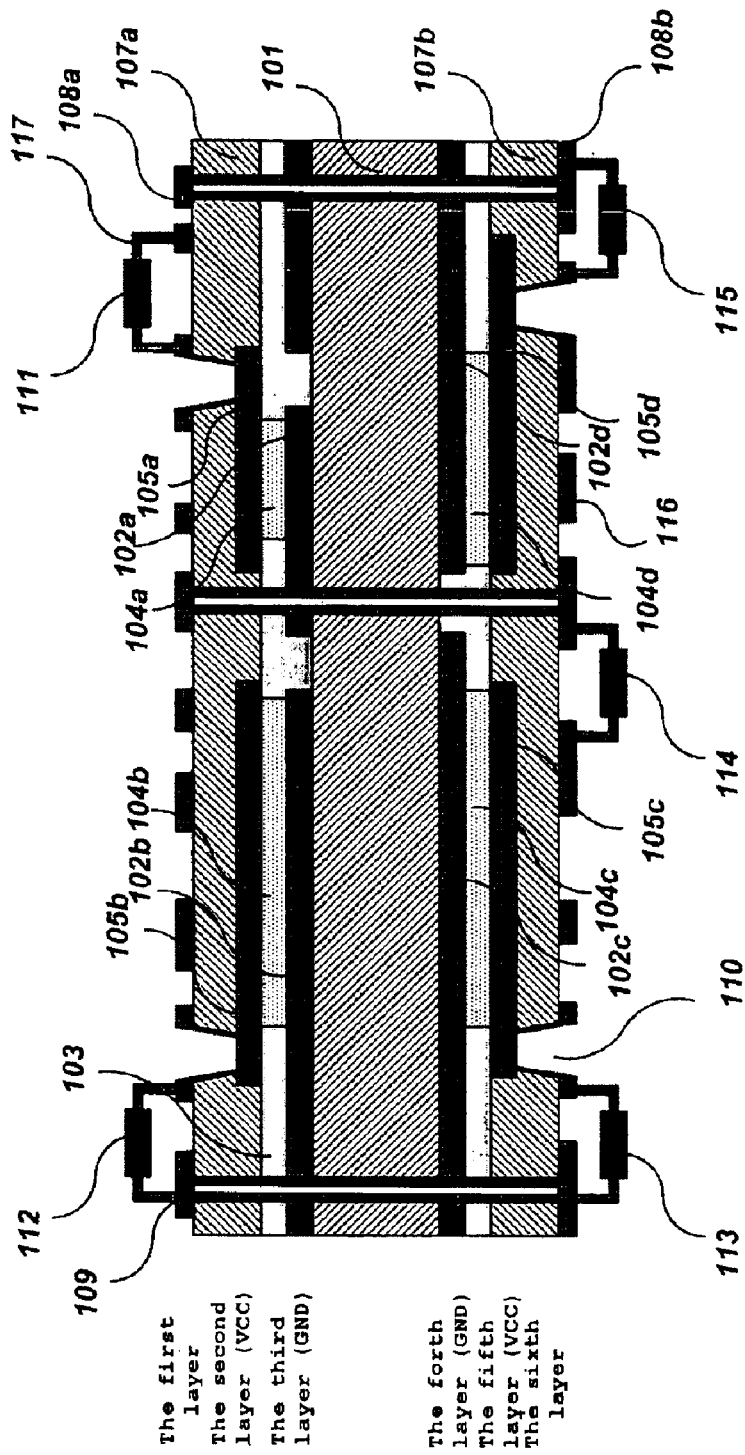
FIG. 6 is a cross-sectional view showing a printed circuit board with embedded capacitors therein according to the present invention, the capacitors being formed by the application of a photosensitive insulating resin and a polymer capacitor paste.

FIG. 6 is a cross-sectional view showing a printed circuit board with embedded capacitors therein according to the present invention, the capacitors being formed by the application of a photosensitive insulating resin and a polymer capacitor paste Referring to FIG. 6, capacitors are formed by applying a photosensitive insulating resin 103 to copper foils formed on a copper clad FR-4 101, applying capacitor pastes 104a to 104d to etched regions of the photosensitive insulating resin 103, and forming top electrodes 105a to 105d on surfaces of the photosensitive insulating resin. The printed circuit board with embedded capacitors therein according to the present invention is commonly composed of six layers wherein the first and the sixth layers designate outer layers of the printed circuit board, and the second to fifth layers designate power layers and ground layers, respectively. Hereinafter, the printed circuit board with embedded capacitors therein according to the embodiments of the present invention will be explained in more detail with reference to a process for manufacturing the printed circuit board as set forth below.

FIGS. 7a to 7i are sectional views showing a process for manufacturing a printed circuit board with embedded capacitors therein according to the present invention.

Figure 7A:
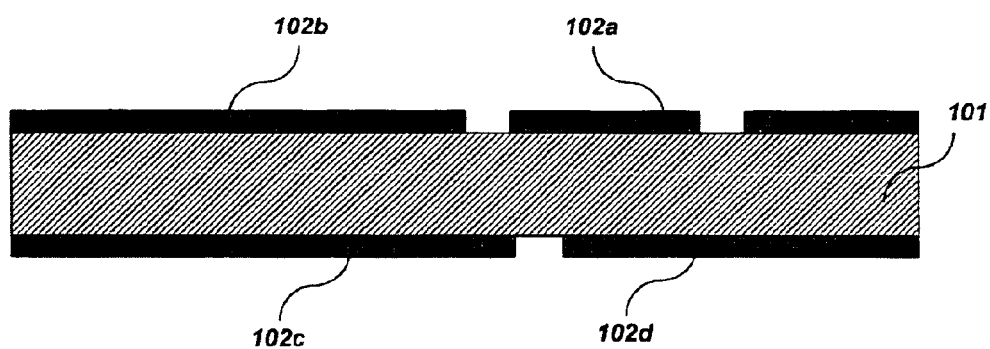
Figure 7B:
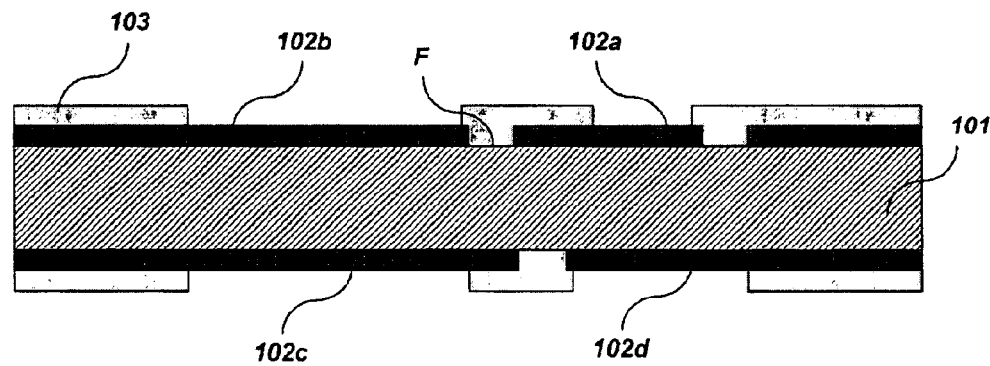

Referring to FIG. 7b, a photosensitive insulating resin 103 is applied to in a thickness of 10~15 $\mu$m, and capacitor pastes 104a to 104d is printed on etched regions 102a to 102d of the photosensitive insulating resin 103. When a high dielectric capacitor paste 104a to 104d having high capacitance is printed and dried to form top electrodes 105a to 105d, cracking of the capacitor pastes at ends of the power electrodes and nonuniform insulation distance between the first layer and the second layer, which are problems of conventional printed circuit boards, can be prevented.

In addition, the embedded capacitors are simply formed by printing and drying the paste at one time in the present invention, while capacitors are formed by printing a copper paste and then drying the copper paste in conventional processes. Accordingly, the occurrence of impurities is minimized during printing in the present invention.

Since the capacitor pastes 104a to 104d used in the process of the present invention are composites of high dielectric $BaTiO_3$ ceramic powders having a dielectric constant of 1,000~10,000 and a thermosetting epoxy resin or polyimide, they ensure high capacitance.

More specifically, the $BaTiO_3$ ceramic powders may be bimodal in terms of their particle size. That is, the $BaTiO_3$ powders are composed of coarse powders having a particle diameter of 0.9 $\mu$m and fine powders having a particle diameter of 60 nm, with a volume ratio in the range of 3:1~5:1. The $BaTiO_3$ powders are homogeneously dispersed in the epoxy resin. As a result, a polymer ceramic composite having a dielectric constant of about 80~90 is obtained. The polymer ceramic composite is printed on regions 102a to 102d where dry films are etched (FIG. 7b).

If the dry films are subjected to light exposure and development to be etched to have a constant area, and the capacitor paste is applied on the etched regions in a uniform height, design capacitance values can be ensured with more precision. After the capacitor pastes 104a to 104d are printed on the etched regions of the dry films and dried, 2~3 $\mu$m of the overfilled capacitor pastes 104a to 104d are polished off using a ceramic buff so as to adjust to the height of the photosensitive insulating resin 103.

Thereafter, copper foil layers having a thickness of 0.5~1 $\mu$m are formed using an electroless copper plating process, and further copper foil layers 105 of 12–18 $\mu$m are deposited on the electroless-plated copper foil layers using an electro copper plating process to form 15~18 $\mu$m thick top copper foil layers. In order to form top electrodes, circuit patterns are formed on the top copper foil layers, copper formed on the photosensitive insulating resin 103 is etched away to form copper foil layers 105a to 105d only on the capacitor pastes 104a to 104d.

As described above, since the technique according to the patent issued to Motorola Inc. comprises printing a photo-dielectric resin on the entire surface of bottom electrodes, exposing to UV-light, and etching to remove regions of a dielectric material exposed to the UV-light, more of a photo-dielectric resin than expected is required even to form a small number of the embedded capacitors. In the present invention, however, the capacitor pastes 104a to 104d are printed on only desired regions. Accordingly, the present invention is economically advantageous in terms of less use of raw materials. In addition, the present invention does not use the photo-dielectric resin and an etchant for etching the photo-dielectric resin, which is economically advantageous in terms of low manufacturing cost.

As described above, since the technique according to the patent issued to Sanmina Corp. comprises inserting an FR-4 resin between copper foil layers to form power distributed decoupling capacitors, the number of layers of the substrates is increased. In the present invention, however, signal matching discrete capacitors (10~100 pF, low capacity, small area) for EMI filter such as a first capacitor (102a+

104a+105a), or decoupling capacitors such as a second (102b+104b+105b) to a forth capacitor (102d+104d+105d) connected to a power section (VCC) and a ground section (GND), can be formed in the same layer, as shown in FIG. 6. The decoupling capacitors have high capacitance (10~100 nF, large area).

Hereinafter, the process for manufacturing the printed circuit board with embedded capacitors according to the present invention will be explained in more detail with reference to FIGS. 7a to 7i.

FIGS. 7a to 7i are sectional views showing a process for manufacturing the printed circuit board with embedded capacitors therein according to the present invention.

In step 1, photoresist dry films are laminated to surfaces of a copper clad FR-4 101 composed of copper foils and a dielectric resin arranged therein, and then subjected to light exposure and development. Thereafter, predetermined regions of the dry films are etched to form bottom electrodes 102a to 102d (FIG. 7a). At this step, the bottom electrodes 102a to 102d are used as ground electrodes 102b, 102c and 102d of decoupling capacitors or a bottom electrode 102a of a signal matching discrete capacitor, respectively.

In step 2, a photosensitive insulating resin 103 is applied to surfaces of the bottom electrodes 102a to 102d and subjected to light exposure and development to etch regions where a capacitor paste is to be applied (FIG. 7b). At this step, the photosensitive insulating resin 103 is subjected to light exposure and development to be etched to have a constant area and height, and thus has a uniform capacitance. In addition, the photosensitive insulating resin 103 is filled in etched regions (designated by F) between the ground electrodes 102b, 102c and 102d of decoupling capacitors and the bottom electrode 102a of signal matching discrete capacitors to act as an insulating layer. The photosensitive insulating resin 103 permanently remains in the printed circuit board to be manufactured.

Figure 7C:
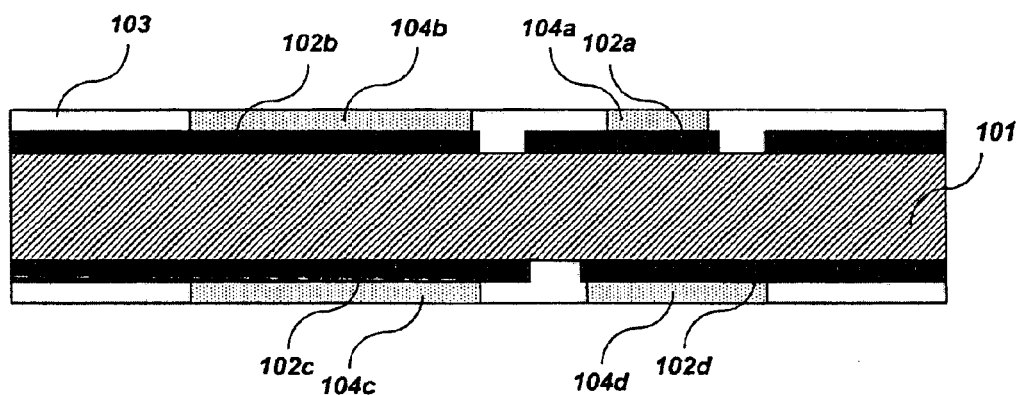

In step 3, capacitor pastes 104a to 104d is applied to regions which the photosensitive insulating resin 103 is etched, and then cured (FIG. 7c). Specifically, the capacitor pastes 104a to 104d is applied using a screen-printing manner, and then dried in a common oven drier at 150~170° C. for 30 minutes. 2~3 µm of the printed and dried capacitor pastes 104a to 104d are polished off using a ceramic buff so as to adjust to the height of the photosensitive insulating resin 103.

Figure 7D:
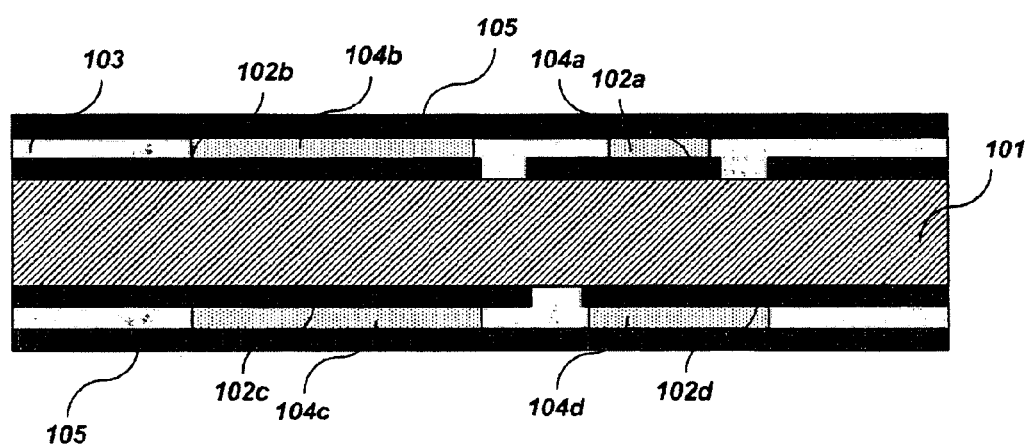

In step 4, plating is carried out on surfaces of the cured capacitor pastes 104a to 104d and the photosensitive insulating resin 103 to form copper foil layers 105. Specifically, 1~2 µm thick copper foil layers are formed on surfaces of the cured capacitor pastes 104a to 104d and the photosensitive insulating resin 103 using an electroless plating process and further about 10~15 µm thick copper foil layers 105 are formed on the electroless-plated copper foil layers using an electro plating process (FIG. 7d).

Figure 7E:
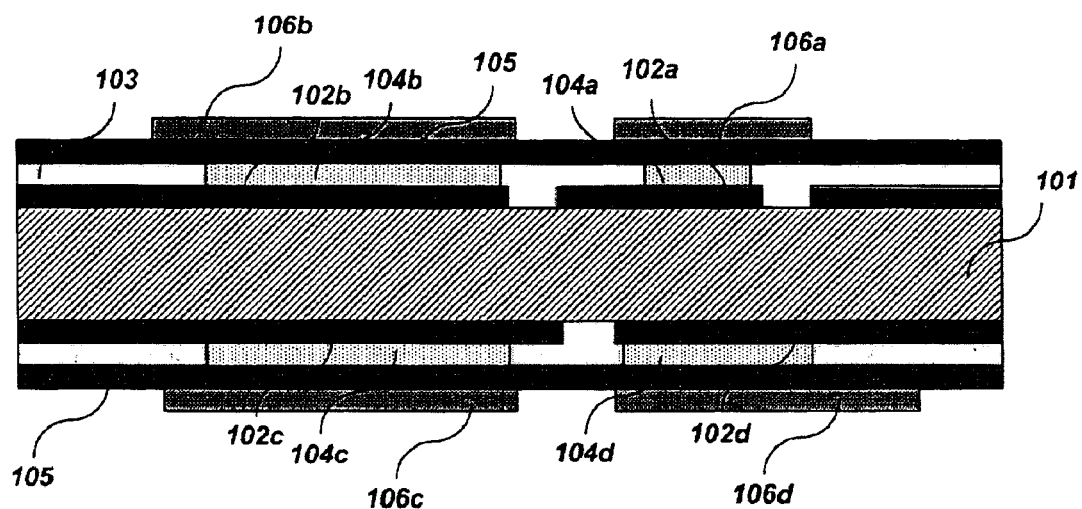

In step 5, photoresist dry films 106a to 106d are laminated to the copper foil layers 105, and subjected to light exposure and development to etch regions 106a to 106d of the dry films except for the copper foil layers where top electrodes are to be formed. At this step, the copper foil layers for top electrodes 105 have broader lands than the regions applied by the capacitor pastes 104a to 104d (FIG. 7e).

Figure 7F:
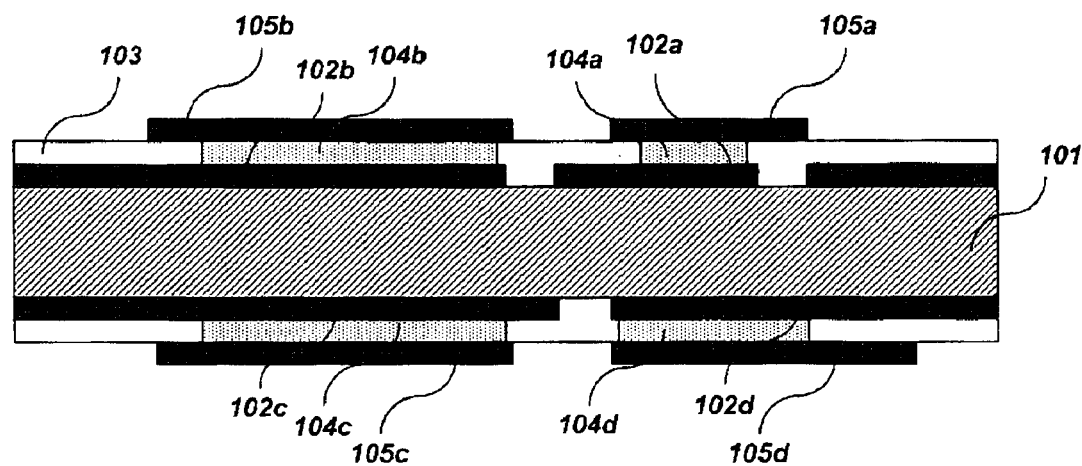

In step 6, regions except for the copper foil layers 105 where top electrodes are to be formed are etched, and the dry films formed on the top electrodes are removed so that the capacitor pastes 104a to 104d are discretely positioned between the top electrodes 105a to 105d and the bottom electrodes 102a to 102d to form discrete capacitors (FIG. 7f).

Figure 7G:
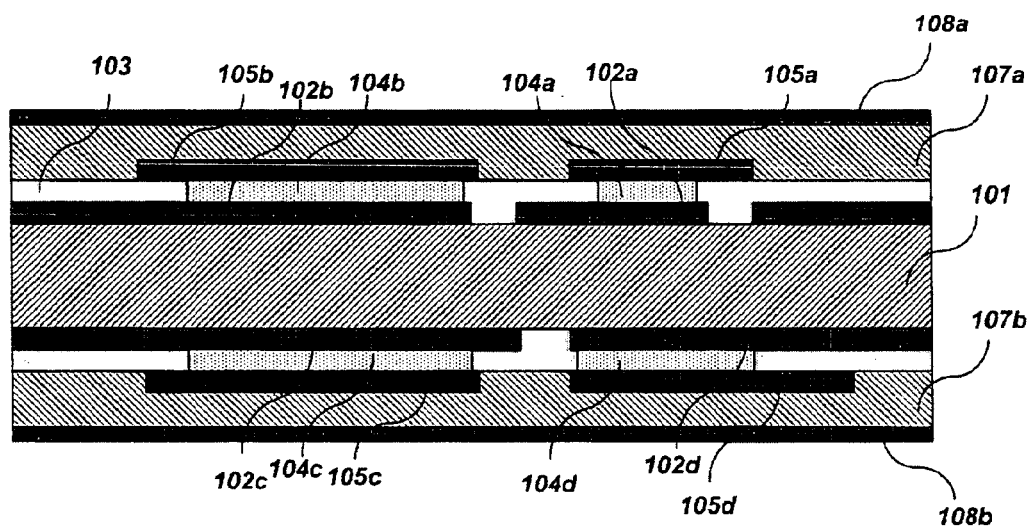

In step 7, resin coated copper (RCC) layers (107a+108a, 107b+108b) are laminated to the capacitors formed by the top electrodes 105a to 105d using a build-up process (FIG. 7g).

Figure 7H:
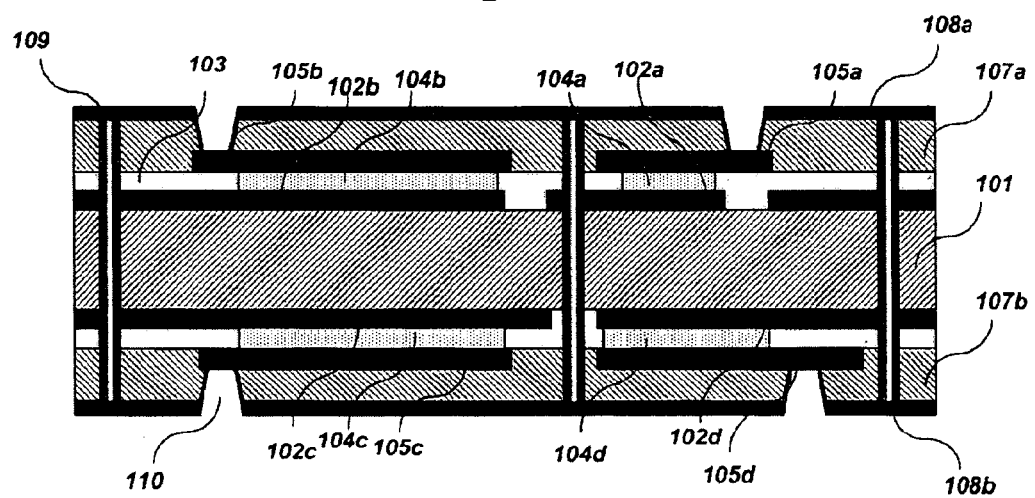

In step 8, micro-via holes 110 are formed through the resin coated copper (RCC) layers (107a+108a, 107b+108b), and through-holes 109 are formed using a mechanical drill. Thereafter, plating is carried out on the via holes 110 and the through holes 109 using an electroless plating process. At this step, the via holes 110 are connected to the top electrodes 105a to 105d, and the through holes 109 are connected to the bottom electrodes 102a to 102d, respectively (FIG. 7h).

In step 9, signal circuit patterns 116 are formed on the resin coated copper (RCC) layers (107a+108a, 107b+108b). Thereafter, IC chips 111 to 115 having different operating voltages are connected to power distributed decoupling capacitors (a second, a third and a fourth capacitors) commonly connected the ground electrodes 102a to 102d, and a signal matching capacitor (a first capacitor) singly connected to the ground electrodes, respectively, depending on the divided top electrodes 105a to 105d and bottom electrodes 102a to 102d. Thus, a multilayered printed circuit board with embedded the signal matching capacitor and the power distributed decoupling capacitors therein is manufactured (FIG. 7i). Herein, the first to fourth capacitors are referred to as "the capacitor pastes" for convenience, but further include the top electrodes 105a to 105d and the bottom electrodes 102a to 102d in addition to the capacitor pastes 104a to 104d. Reference numeral 117 designates wire bindings for connecting the IC chips 111 to 115 to the capacitors.

As described above, an FR-4 (Dk 4.5) sheet as a dielectric material for forming capacitors is used in the technique of Sanmina Corp., while a ceramic powders-containing epoxy resin (Dk 70~90) in the form of a paste is used for forming capacitors in the present invention. Accordingly, the former capacitors exhibit a capacitance of 350~400 pF/cm$^2$ (when the insulation thickness is 10 µm), while the latter capacitors exhibit a capacitance of 5~7 nF/cm$^2$ (when the insulation thickness is 10 µm), which is about 12 to 16 times higher than the capacitance of the former capacitors. In conclusion, the embedded capacitors used in the present invention can ensure high capacitance, in particular, high capacitance per unit area.

In accordance with the present invention, the power distributed decoupling capacitors 104b, 104c and 104d of Sanmina Corp. and the signal matching discrete capacitor 104a of Motorola Inc. used in a radio frequency (RF) module can be simultaneously formed.

In accordance with the present invention, the photosensitive insulating resin 103 is subjected to light exposure and development, and then the polymer capacitor pastes 104a to 104d are applied to regions where the photosensitive insulating resin is etched, thereby ensuring the capacitance per unit area with more precision and reducing print eccentricity occurring during printing.

In addition, when connected to the top electrodes 105a to 105d through the micro-via holes 110, the capacitor pastes 104a to 104d are connected to the lands, instead of to the top copper electrodes on the capacitor pastes 104a to 104d. Accordingly, the capacitor pastes 104a to 104d are not affected by any thermal and mechanical shocks during formation of the micro-via holes using a laser drill.

Furthermore, since the use of the photosensitive insulating resin 103 can ensure uniform thickness, the micro-via holes 110 can be formed in a uniform depth using a laser drill and the insulating layer between the first layer and the second layer can have uniform thickness. Accordingly, the process for manufacturing a printed circuit board with embedded capacitors therein according to the present invention can be applied to products usable even at relatively high frequencies.

In accordance with the present invention, a photosensitive insulating resin and a polymer capacitor paste are applied to form embedded capacitors, thereby ensuring high capacitance values, in particular, high capacitance per unit area with more precision.

In accordance with the present invention, power distributed decoupling capacitors and signal matching discrete capacitors can be simultaneously formed.

In accordance with the present invention, since the thickness of a photosensitive insulating resin applied on entire surfaces of the printed circuit board inner layer can be maintained to be constant, thereby being applicable to products usable even at relatively high frequencies.

In accordance with the present invention, a capacitor paste can be printed only on desired regions of a photosensitive insulating resin and an etchant for etching the photosensitive insulating resin is not required, thereby decreasing the use of expensive raw materials. Accordingly, the printed circuit board with embedded capacitors therein according to the present invention can be manufactured at low cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A process for manufacturing a printed circuit board with embedded capacitors therein, comprising the steps of:
    i) laminating photoresist dry films to a copper clad FR-4, exposing to light and developing the dry films, and etching copper foils of the copper clad FR-4 to form bottom electrodes for forming capacitors;
    ii) applying a photosensitive insulating resin to the surfaces of the bottom electrodes, and exposing to light and developing to etch the photosensitive insulating resin;
    iii) applying a capacitor paste to the etched regions and curing the capacitor paste;
    iv) plating the upper regions of the cured capacitor paste and the photosensitive insulating resin using an electroless copper plating process to form copper foil layers for top electrodes;
    v) laminating photosensitive dry films to the copper foil layers for top electrodes, and exposing to light and developing the photosensitive dry films to etch regions of the dry films except for the copper foil layers where the top electrodes are to be formed; and
    vi) etching the regions of the dry films except for the copper foil layers where the top electrodes are to be formed, and the dry films formed on the top electrodes are removed so that the capacitor paste is discretely positioned between the top electrodes and the bottom electrodes to form discrete capacitors.

2. The process for manufacturing a printed circuit board with embedded capacitors therein according to claim 1, wherein in step ii), the photosensitive insulating resin is applied on the surfaces of the bottom electrodes so that the capacitor paste is printed in a uniform height.

3. The process for manufacturing a printed circuit board with embedded capacitors therein according to claim 1, wherein in step ii), the photosensitive insulating resin is filled in etched regions of ground electrodes of power distributed decoupling capacitors and bottom electrodes of signal matching discrete capacitors to act as an insulating layer, and permanently remains in the printed circuit board.

4. The process for manufacturing a printed circuit board with embedded capacitors therein according to claim 1, wherein the step iii) further includes applying the capacitor paste using a screen-printing manner, and curing the applied capacitor paste in an oven drier at 150~170° C. for 30 minutes.

5. The process for manufacturing a printed circuit board with embedded capacitors therein according to claim 1, wherein the capacitor paste is a composite of high dielectric $BaTiO_3$ ceramic powders having a dielectric constant of 1,000~10,000 and a thermosetting epoxy resin or polyimide.

6. The process for manufacturing a printed circuit board with embedded capacitors therein according to claim 1, wherein the capacitor paste is a polymer ceramic composite having a dielectric constant of about 80~90, the polymer ceramic composite being obtained by homogeneously dispersing the $BaTiO_3$ powders composed of coarse powders having a particle diameter of 0.9 $\mu$m and fine powders having a particle diameter of 60 nm (bimodal form) in the epoxy resin in a volume ratio of 3:1~5:1.

7. The process for manufacturing a printed circuit board with embedded capacitors therein according to claim 1, wherein the copper foil layers for top electrodes have broader lands than the regions applied by the capacitor paste.

8. The process for manufacturing a printed circuit board with embedded capacitors therein according to claim 1, wherein the step iii) further includes polishing 2~3 $\mu$m of the printed and dried capacitor paste using a ceramic buff so as to adjust the height to be uniform.

9. The process for manufacturing a printed circuit board with embedded capacitors therein according to claim 1, wherein the step iv) includes plating 1~2 $\mu$m thick copper foil layers on surfaces of the cured capacitor paste and the photosensitive insulating resin using an electroless plating process and further plating 10~15 $\mu$m thick copper foil layers on the electroless-plated copper foil layers using an electro plating process.

10. The process for manufacturing a printed circuit board with embedded capacitors therein according to claim 1, further comprising the steps of:
    vii) laminating resin coated copper (RCC) layers to the entire surface of the top electrodes; and
    viii) forming micro-via holes and through holes through the resin coated copper (RCC) layers and then plating the micro-via holes and the through holes.

11. The process for manufacturing a printed circuit board with embedded capacitors therein according to claim 10, wherein the resin coated copper (RCC) layers are laminated by a build-up process.

12. The process for manufacturing a printed circuit board with embedded capacitors therein according to claim 10, wherein the through holes are connected to the bottom electrodes and the via holes are connected to the top electrodes, respectively.

13. The process for manufacturing a printed circuit board with embedded capacitors therein according to claim 10, wherein the step viii) includes forming the micro-via holes using a laser drill, forming the through-holes using a mechanical drill, and plating the micro-via holes and the through-holes using an electroless plating process.

14. The process for manufacturing a printed circuit board with embedded capacitors therein according to claim 10, further comprising the step of ix) forming signal circuits on the resin coated copper (RCC) layers, and connecting IC chips having different operating voltages to the signal matching capacitors and the power distributed decoupling capacitors commonly connected the ground electrodes, respectively, depending on the divided top electrodes and bottom electrodes.

* * * * *